United States Patent
Ning

(10) Patent No.: US 11,978,525 B2
(45) Date of Patent: May 7, 2024

(54) BASE DIE, MEMORY SYSTEM, AND SEMICONDUCTOR STRUCTURE

(71) Applicant: CHANGXIN MEMORY TECHNOLOGIES, INC., Hefei (CN)

(72) Inventor: Shu-Liang Ning, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 157 days.

(21) Appl. No.: 17/662,064

(22) Filed: May 4, 2022

(65) Prior Publication Data

US 2023/0139658 A1 May 4, 2023

(30) Foreign Application Priority Data

Oct. 29, 2021 (CN) .......................... 202111275390.X

(51) Int. Cl.
| | |
|---|---|
| *H01L 25/065* | (2023.01) |
| *G11C 29/12* | (2006.01) |
| *G11C 29/42* | (2006.01) |
| *G11C 29/44* | (2006.01) |

(52) U.S. Cl.
CPC .... *G11C 29/4401* (2013.01); *G11C 29/12015* (2013.01); *G11C 29/42* (2013.01); *H01L 25/0652* (2013.01)

(58) Field of Classification Search
CPC .......... G11C 29/4401; G11C 29/12015; G11C 29/42; H01L 25/0652
USPC ...................................... 365/185.09
See application file for complete search history.

(56) References Cited

U.S. PATENT DOCUMENTS

| | | | |
|---|---|---|---|
| 10,922,014 B1* | 2/2021 | Henze | G06F 3/0679 |
| 11,416,335 B2 | 8/2022 | Cho et al. | |
| 2010/0115376 A1* | 5/2010 | Shalvi | G06F 11/1068 |
| | | | 714/763 |
| 2017/0093438 A1* | 3/2017 | Motwani | G11C 29/52 |
| 2017/0177246 A1* | 6/2017 | Miller | G06F 11/1666 |
| 2018/0059933 A1* | 3/2018 | Helmick | G06F 3/0683 |
| 2020/0371871 A1* | 11/2020 | Li | G11C 29/52 |
| 2021/0311868 A1* | 10/2021 | Chen | G11C 11/5628 |
| 2021/0373993 A1* | 12/2021 | Sharon | G11C 16/0483 |

* cited by examiner

*Primary Examiner* — Ly D Pham
(74) *Attorney, Agent, or Firm* — Syncoda LLC; Feng Ma

(57) ABSTRACT

A base die is configured to: receive first data in a writing phase, perform error correction code encoding processing to generate encoded data, and transmit second data to a memory die in the writing phase, wherein the second data includes the first data and the encoded data; and receive the second data from the memory die in a reading phase, perform error checking and correction processing, and transmit third data in the reading phase, wherein the third data is the first data after the error checking and correction processing.

20 Claims, 7 Drawing Sheets

US 11,978,525 B2

BASE DIE, MEMORY SYSTEM, AND SEMICONDUCTOR STRUCTURE

CROSS-REFERENCE TO RELATED APPLICATION

This application claims priority to Chinese Patent Application No. 202111275390.X filed on Oct. 29, 2021, the disclosure of which is hereby incorporated by reference in its entirety.

BACKGROUND

Semiconductor memories can be divided into non-volatile memories and volatile memories. A dynamic random access memory (DRAM), as a volatile memory, has the advantages of high storage density and high read/write speed, and is widely used in various electronic systems.

As the DRAM has an increasingly advanced process and higher storage density, data stored in the DRAM may have errors, which may seriously affect the performance of the DRAM. Therefore, the error checking and correction or error correction coding (ECC) technology is usually used in the DRAM to detect or correct errors of the stored data.

SUMMARY

Embodiments of the present application relate to the technical field of semiconductors, and in particular, to a base die, a memory system, and a semiconductor structure.

According to some embodiments of the present application, in an aspect of the embodiments of the present application, a base die applied to a memory system is provided, wherein the base die is configured to receive first data in a writing phase, perform error correction code (ECC) encoding processing to generate encoded data, and transmit second data to a memory die in the writing phase, wherein the second data includes the first data and the encoded data; and receive the second data from the memory die in a reading phase, perform error checking and correction processing, and transmit third data in the reading phase, wherein the third data is the first data after the error checking and correction processing.

According to some embodiments of the present application, in another aspect of the embodiments of the present application, a memory system is provided, including a processor, a base die, and a memory die, wherein the processor is configured to transmit first data to the base die in a writing phase; the base die is configured to: receive the first data in the writing phase, perform ECC encoding processing to generate encoded data, and transmit second data to the memory die in the writing phase, wherein the second data includes the first data and the encoded data; and receive the second data from the memory die in a reading phase, perform error checking and correction processing, and transmit third data to the processor in the reading phase, wherein the third data is the first data after the error checking and correction processing; and the memory die is configured to receive the second data from the base die and store the second data in the writing phase, and transmit the second data to the base die in the reading phase.

According to some embodiments of the present application, in further another aspect of the embodiments of the present application, a semiconductor structure is further provided, including: a carrier substrate; and the memory system described above, wherein the processor and the base die are both located on a surface of the carrier substrate, and the memory die is located on a surface of the base die that is away from the carrier substrate.

BRIEF DESCRIPTION OF THE DRAWINGS

One or more embodiments are exemplified by corresponding drawings, and these exemplified descriptions do not constitute a limitation on the embodiments. Components with the same reference numerals in the drawings are denoted as similar components, and the drawings are not limited by scale unless otherwise specified.

DETAILED DESCRIPTION

Figure 1:
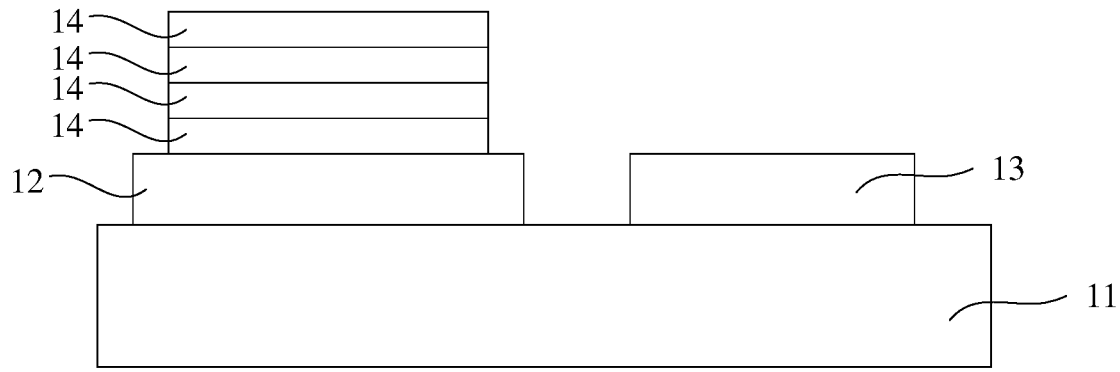
FIG. 1 is a schematic structural diagram of a semiconductor structure.
Figure 2:
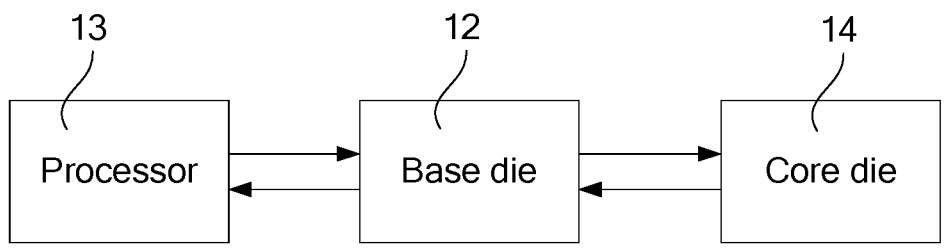
FIG. 2 is a schematic diagram of data transmission in the semiconductor structure provided in FIG. 1.

FIG. 1 is a schematic structural diagram of a semiconductor structure; FIG. 2 is a schematic diagram of data transmission in the semiconductor structure provided in FIG. 1.

Referring to FIG. 1, a semiconductor structure may include: a substrate 11; a base die 12 and a processor 13 that are located on a surface of the substrate 11; and a plurality of core dies 14 stacked on the base die 12, wherein the core dies 14 may be DRAM dies. Referring to FIG. 2, a data transmission process in the semiconductor structure includes: in a writing phase, the processor 13 transmits data to the base die 12, and the base die 12 transmits the data to the core die 14; before transmitting the data, the processor 13 may first perform error correction code (ECC) encoding processing on the data. In a reading phase, the core die 14 transmits data to the base die 12, and then the base die 12 transmits the data to the processor 13; the processor 13 receives the data and performs ECC decoding processing on the data, to implement detect and correct errors of the data.

Obviously, in the semiconductor structure, the base die 12 does not participate in the error checking and correction processing. That is, the base die 12 does not have an ECC encoding function and the corresponding error checking and correction function, and the error detection needs to be completed by the processor 13 or the core die 14. This makes the originally tight die areas of the processor 13 and the core die 14 even tighter, which affects the performance of the processor 13 and the core die 14. Therefore, the storage performance of the entire semiconductor structure still needs to be improved.

Figure 3:
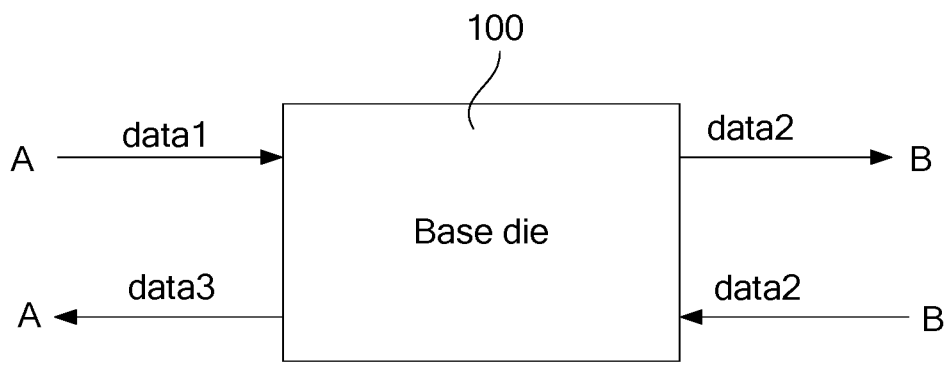
FIG. 3 is a first schematic structural diagram of a base die according to an embodiment of the present application.
Figure 4:
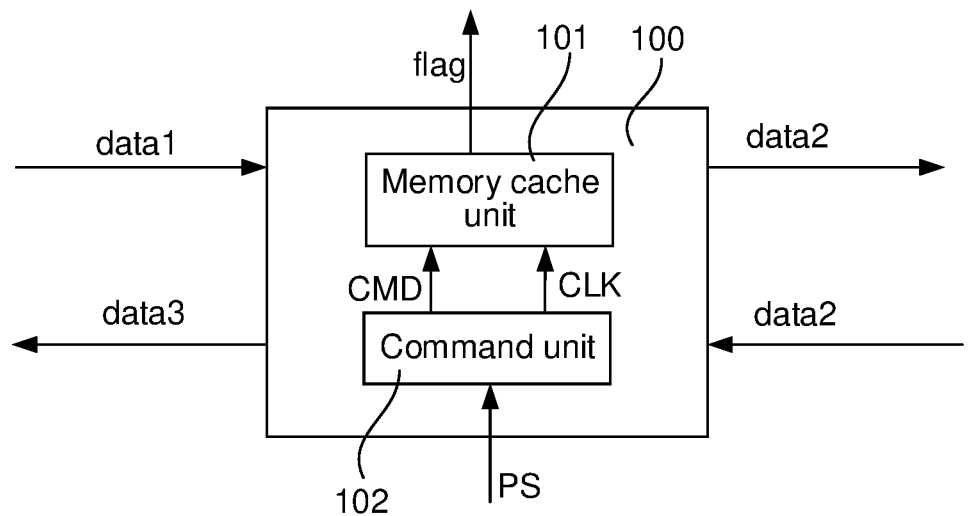
FIG. 4 is a second schematic structural diagram of a base die according to an embodiment of the present application.
Figure 5:
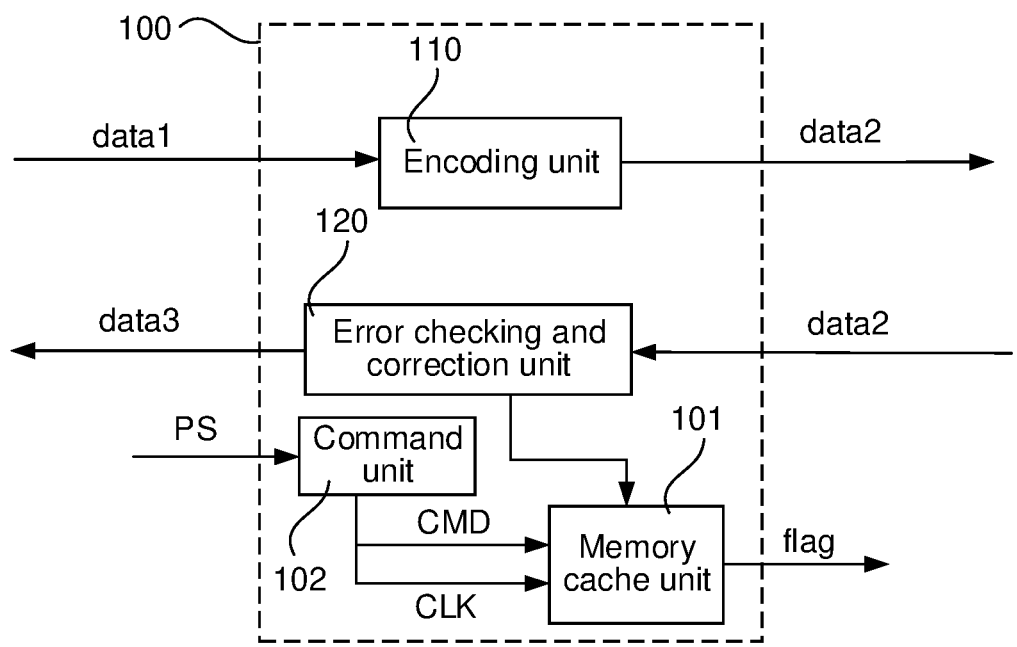
FIG. 5 is a third schematic structural diagram of a base die according to an embodiment of the present application.
Figure 6:
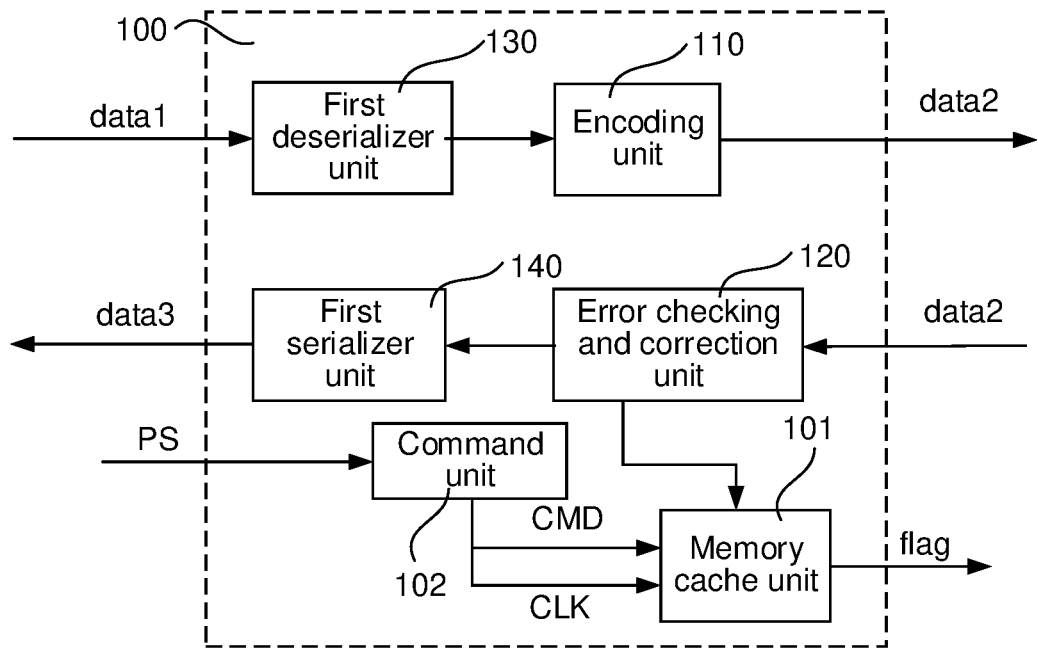
FIG. 6 is a fourth schematic structural diagram of a base die according to an embodiment of the present application.
Figure 7:
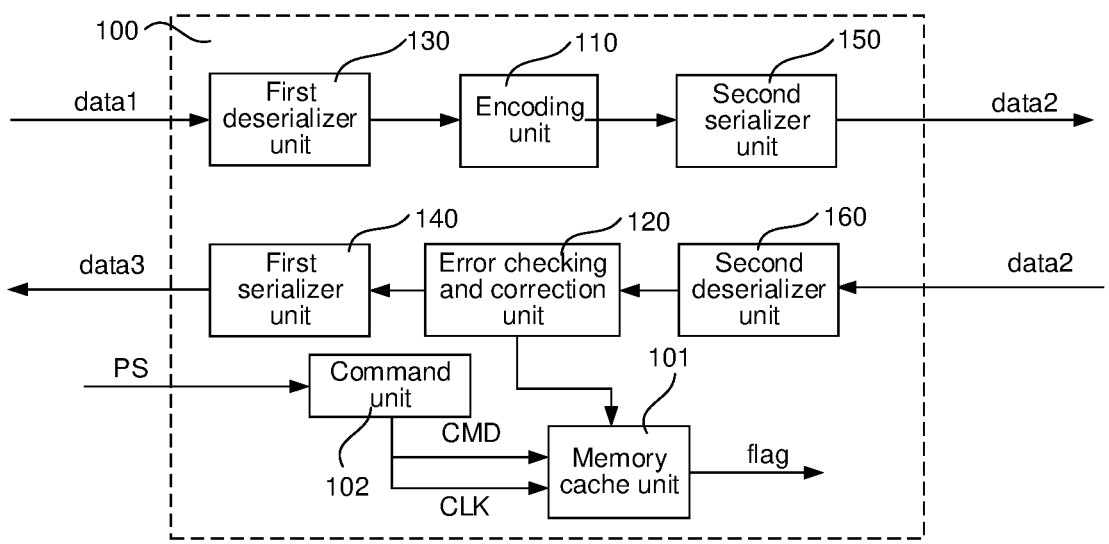
FIG. 7 is a fifth schematic structural diagram of a base die according to an embodiment of the present application.

Embodiments of the present application provide a base die, a memory system, and a semiconductor structure. The base die has an error checking and correction function. FIG. 3 is a first schematic structural diagram of a base die according to an embodiment of the present application; FIG. 4 is a second schematic structural diagram of a base die according to an embodiment of the present application; FIG. 5 is a third schematic structural diagram of a base die according to an embodiment of the present application; FIG. 6 is a fourth schematic structural diagram of a base die according to an embodiment of the present application; and FIG. 7 is a fifth schematic structural diagram of a base die according to an embodiment of the present application.

In order to make the objectives, technical solutions and advantages of the embodiments of the present application clearer, the embodiments of the present application are described below with reference to the accompanying drawings. Those of ordinary skill in the art should understand that many technical details are proposed in each embodiment of the present application to help the reader better understand the present application. However, even without these technical details and various changes and modifications made based on the following embodiments, the technical solutions claimed in the present application may still be realized.

In the technical solution of the base die provided by the embodiments of the present application, the base die performs ECC encoding processing on first data in a writing phase to generate encoded data, and transmits second data including the first data and the encoded data to a memory die; moreover, the base die receives the second data from the memory die in a reading phase, performs error checking and correction processing, and transmits third data, wherein the third data is the first data after the error checking and correction processing. Therefore, the base die has an encoding processing function and an error checking and correction function, so that neither the processor nor the memory die in the memory system needs to have the encoding processing function and the error checking and correction function, which helps improve the performance of the processor and memory die and rationally use the die area of the base die, thereby improving the storage performance of the memory system.

Referring to FIG. 3, a base die 100 is applied to a memory system, wherein the base die 100 is configured to receive first data data1 in a writing phase, perform ECC encoding processing to generate encoded data, and transmit second data data2 to a memory die in the writing phase, wherein the second data data2 includes the first data data1 and the encoded data; and receive the second data from the memory die in a reading phase, perform error checking and correction processing, and transmit third data data3 in the reading phase, wherein the third data data3 is the first data data1 after the error checking and correction.

In the embodiments of the present application, the base die 100 participates in the ECC encoding processing and the error checking and correction processing in the data transmission process.

In some embodiments, the base die 100 may be connected between a first port A and a second port B, wherein the first port A is connected to a data transmission port of a processor of the memory system, and the second port B is connected to a data transmission port of a memory die of the memory system. It may be understood that, the first port A and the second port B are general terms. The first port A includes a plurality of data transmission ports, and the second port B includes a plurality of data transmission ports. The number of data transmission ports is correlated to the number of pieces of data to be transmitted by the base die 100. For example, the number of data transmission ports is the same as the number of pieces of data to be transmitted by the base die 100, and one piece of data may be transmitted through one data transmission port.

The ECC encoding processing and the error checking and correction processing are both used for implementing ECC error checking and correction, to discover and locate errors of the first data during transmission and correct the errors. In some embodiments, the ECC error checking and correction may adopt an error correction mechanism of Reed Solomon Code (RS); accordingly, the ECC encoding processing may adopt an RS encoding algorithm to generate encoded data, and decoding processing in the error checking and correction processing may adopt an RS decoding algorithm. In other embodiments, the ECC error checking and correction may adopt an error correction mechanism of Hamming code; accordingly, the ECC encoding processing may adopt a Hamming code encoding algorithm to generate encoded data, and decoding processing in the error checking and correction processing may adopt a Hamming code decoding algorithm.

In some embodiments, the first data data1 may be 256-bit data, and correspondingly, the encoded data may be 16-bit data. It may be understood that, in other embodiments, the encoded data may include different numbers of bits depending on specific algorithms adopted in the ECC encoding processing. In addition, the first data data1 may include other numbers of bits, for example, 128 or 512.

In addition, in some embodiments, the base die 100 may further be configured to: generate an error checking flag signal during the error checking and correction processing, and record errors of the first data data1 during transmission based on the error checking flag signal. Specifically, if the first data data1 has an error during transmission, the error checking flag signal is generated; if the first data data1 has no error during transmission, no error checking flag signal is generated. In addition, in some embodiments, the error checking flag signal may be defined as follows: if the first data data1 has an error during transmission, the error checking flag signal is 1; and if the first data data1 has no error during transmission, the error checking flag signal is 0. In other embodiments, the error checking flag signal may alternatively be defined as follows: if the first data data1 has an error during transmission, the error checking flag signal is 0; and if the first data data1 has no error during transmission, the error checking flag signal is 1.

As shown in FIG. 4, in some embodiments, the base die 100 may further include: a memory cache unit 101, configured to store errors of the first data data1 during transmission; a command unit 102, configured to receive a polling instruction PS, and generate a command signal CMD and a clock signal CLK, wherein the memory cache unit is further configured to output a representation signal flag based on the command signal CMD and the clock signal CLK, wherein the representation signal flag represents the errors of the first data data1 during transmission.

It may be understood that, if no polling instruction PS is received, the memory cache unit 101 only stores the errors of the first data data1 during transmission; after receiving the polling instruction PS, the command unit 102 controls the memory cache unit 102 to output the representation signal flag that represents the errors of the first data data1 during transmission. The errors of the first data data1 can be obtained based on the representation signal flag.

In some embodiments, the representation signal flag may be a binary string. For example, if an error of the first data data1 during transmission is detected, 1 is recorded; if no error of the first data data1 during transmission is detected, 0 is recorded. In this way, after a period of time, the representation signal flag is a binary string of 0s and 1s. In other embodiments, the representation signal flag may alternatively be a decimal value. For example, the memory cache unit 101 may be a counter, and if an error of the first data data1 during transmission is detected, the count is incremented by 1. In this way, after a period of time, the representation signal flag is a decimal value related to the number of errors.

In some embodiments, the memory cache unit 101 may be a First Input First Output (FIFO) register. By using the FIFO register as the memory cache unit 101, a continuous data stream can be cached, to avoid data missing during a storage operation. In addition, the errors of the first data data1 during transmission can be pushed and stored collectively, which can avoid frequent bus operations and help improve the data transmission speed.

In addition, in some embodiments, the clock signal CLK may be generated by the command unit 102 independently; in other embodiments, the clock signal CLK may alternatively be provided from the external, for example, generated by a processor that generates the polling instruction PS.

FIG. 5 is a third schematic structural diagram of a base die according to an embodiment of the present application. Referring to FIG. 5, in some embodiments, the base die 100 may include: an encoding unit 110, configured to receive the first data data1 in the writing phase and perform the ECC encoding processing, to generate encoded data; and an error checking and correction unit 120, configured to receive the second data data2 in the reading phase and perform the error checking and correction processing.

Because the encoding unit 110 and the error checking and correction unit 120 are separate units, which helps further improve the independence of the encoding operation and decoding operation, to avoid the data crosstalk.

The encoding unit 110 may adopt a Hamming code encoding operation or an RS encoding operation; accordingly, the error checking and correction unit 12 may adopt a Hamming code decoding operation or an RS decoding operation. In some embodiments, the encoding unit 110 may receive the first data data1 from the processor and transmit the second data data2 to the memory die; the error checking and correction unit 120 may receive the second data data2 from the memory die, and transmit the first data data1 after the error checking and correction processing to the processor.

FIG. 6 is a fourth schematic structural diagram of a base die according to an embodiment of the present application. Referring to FIG. 6, in some embodiments, in addition to the encoding unit 110 and the error checking and correction unit 120, the base die 100 may further include a first deserializer (DES) unit 130, configured to receive the first data data1 in the writing phase, perform first deserialization processing on the first data data1, and transmit the first data data1 after the first deserialization processing to the encoding unit 110; and a first serializer (SER) unit 140, configured to receive third data data3 in the reading phase, perform first serialization processing on the third data data3, and transmit the third data data3 after the first serialization processing to the processor.

The first deserializer unit 130 and the first serializer unit 140 can reduce the number of transmission channels between the base die 100 and the processor, and increase the number of bits transmitted on each transmission channel. In addition, as the number of transmission channels decreases, the number of data transmission ports required by the base die 100 and the processor can be reduced, to save the die area of the base die 100 and the die area of the processor. The first data data1 is transmitted to the first deserializer unit 130 in a serial manner, and the first deserializer unit 130 is also known as a deserializer, which deserializes the serial first data data1. The first serializer unit 140 performs serialization processing on the third data data3 and transmits the third data data3 after the serialization processing. The first serializer unit 140 is also known as a serializer.

For example, the first data data1 includes 256 bits. In this case, the first data data1 is transmitted to the first deserializer unit 130 through 32 transmission channels. After being deserialized by the first deserializer unit 130, the first data data1 is transmitted in parallel to the encoding unit 110 by using 256 transmission channels. The third data includes 256 bits. After the serialization processing by the first serializer unit 140, the third data datat3 is converted into 32 streams of data. Correspondingly, the 32 streams of data may be transmitted through 32 transmission channels.

FIG. 7 is a fifth schematic structural diagram of a base die according to an embodiment of the present application. Referring to FIG. 7, in some embodiments, in addition to the encoding unit 110, the error checking and correction unit 120, the first deserializer unit 130, and the first serializer unit 140, the base die 100 may further include: a second serializer unit 150, configured to receive the second data data2 from the encoding unit 110 in the writing phase, perform second serialization processing, and transmit the second data data2 after the second serialization processing to the memory die; and a second deserializer unit 160, configured to receive the second data data2 from the memory die in the reading phase, perform second deserialization processing, and transmit the second data data2 after the second deserialization processing to the error checking and correction unit 120.

The second serializer unit 150 performs serialization processing on the second data data2 on which the ECC encoding processing has been performed, which helps reduce the number of transmission channels between the base die 100 and the memory die, so as to reduce the number of data transmission ports required by the base die 100 and the memory die, thereby saving the die area of the base die 100 and the die area of the memory die. For example, the second data data2 may include 256-bit first data data1 and 16-bit encoded data. After serialization processing by the second serializer unit 150, the second data data2 can be transmitted to the memory die by using 128+8 transmission channels, wherein each of the 128 transmission channels transmits 2 bits of the 256-bit data, and each of the 8 transmission channel transmits 2 bits of the 16-bit data.

The second deserializer unit 160 performs parallel processing on the second data data2 transmitted from the memory die, that is, performs deserialization processing on the second data data2, and the second data data2 after the deserialization processing is transmitted to the error checking and correction unit 120. For example, the second deserializer unit 160 may convert the (128+8) streams of second data data2 into (256+16)-bit parallel data.

In addition, in some embodiments, during the error checking and correction processing, the error checking and correction unit 120 may further generate an error checking flag signal. Further referring to FIG. 4 to FIG. 7, in some embodiments, the base die 100 may further include: a memory cache unit 101, configured to store errors of the first data data1 during transmission; and a command unit 102, configured to receive a polling instruction PS, and generate a command signal CMD and a clock signal CLK, wherein the memory cache unit 101 is further configured to output a representation signal flag based on the command signal CMD and the clock signal CLK, and the representation signal flag represents the errors of the first data data1 during transmission.

For the detailed description of the memory cache unit 101 and the command unit 102, reference may be made to the corresponding description of the foregoing embodiment, and details are not described herein again.

The base die 100 provided in the foregoing embodiment not only has a data transmission function, but also has an ECC encoding processing function and an error checking and correction processing function. In this way, the die area of the base die 100 can be effectively used, to reduce the pressure on the die areas of the processor and the memory die and save the die areas of the processor and the memory die.

In addition, the base die 100 may further have data serialization processing and serialization processing functions, which helps reduce the number of transmission channels between the processor and the base die 100 and reduce the number of transmission channels between the memory die and the base die 100, thereby reducing the number of data transmission ports required by the processor, the base die 100, and the memory die, and saving die areas of the processor, the base die 100, and the memory die.

Another embodiment of the present application further provides a memory system, wherein the memory system includes a processor, a memory die, and the base die provided in the foregoing embodiment. The memory system provided by another embodiment of the present application is described in detail below with reference to the drawings. It should be noted that, for the parts the same as or corresponding to those mentioned in the foregoing embodiment, reference may be made to the foregoing embodiment, and details will not be described herein again.

Figure 8:
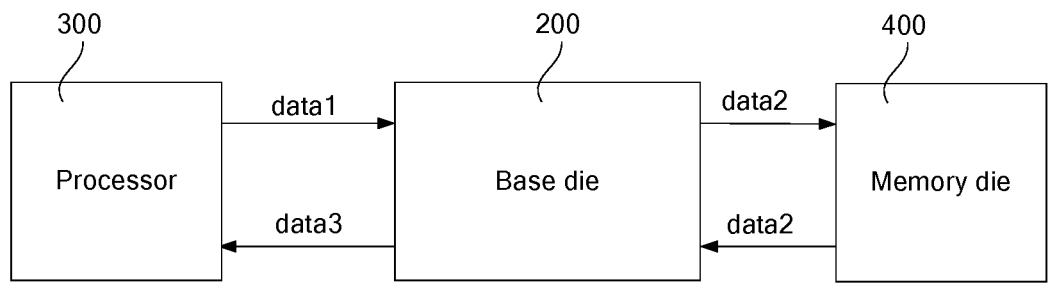
FIG. 8 is a first schematic structural diagram of a memory system according to an embodiment of the present application.

FIG. 8 is a first schematic structural diagram of a memory system according to an embodiment of the present application.

Referring to FIG. 8, the memory system includes: a base die 200, a processor 300, and a memory die 400. The processor 300 is configured to transmit first data data1 to the base die 200 in a writing phase. The base die 200 is configured to: receive the first data data1 in the writing phase, perform ECC encoding processing to generate encoded data, and transmit second data data2 to the memory die 400 in the writing phase, wherein the second data data2 includes the first data data1 and the encoded data; and receive the second data data2 from the memory die 400 in a reading phase, perform error checking and correction processing, and transmit third data data3 to the processor 300 in the reading phase, wherein the third data data3 is the first data data1 after the error checking and correction processing. The memory die 400 is configured to receive the second data data2 from the base die 200 in the writing phase, store the second data data2, and transmit the second data data2 to the base die 200 in the reading phase.

In the memory system, the ECC encoding processing and the error checking and correction processing on the data are implemented by the base die 200. Therefore, neither the processor 300 nor the memory die 400 needs to perform the encoding processing and the error checking and correction processing, so that functions required by the processor 300 and the memory die 400 are reduced, which can make the die areas of the processor 300 and the memory die 400 less tight, thereby better improving the performance of the processor 300 and the memory die 400. For example, the reliability of the memory die 400 can be improved, thus enhancing the storage performance of the memory system.

In some embodiments, the memory system may be a DRAM memory system, for example, a double data rate (DDR) 4 DRAM memory system, or a DDR5 DRAM memory system. In other embodiments, the memory system may alternatively be a Static Random-Access Memory (SRAM) memory system, a NAND memory system, a NOR memory system, a FeRAM memory system, or a PcRAM memory system.

The base die 200 can provide a high-speed interface for data transmission in the memory system. In addition, the base die 200 is further configured to manage and control the memory die 400. In some embodiments, the base die 200 may be configured to perform temperature monitoring and temperature management on the memory die 400, and may further be configured to perform a Memory Build-In-Self Test (MBIST) on the memory die 400 and self-repair. In addition, the base die 200 is further configured to perform error checking and correction on transmitted data.

Figure 9:
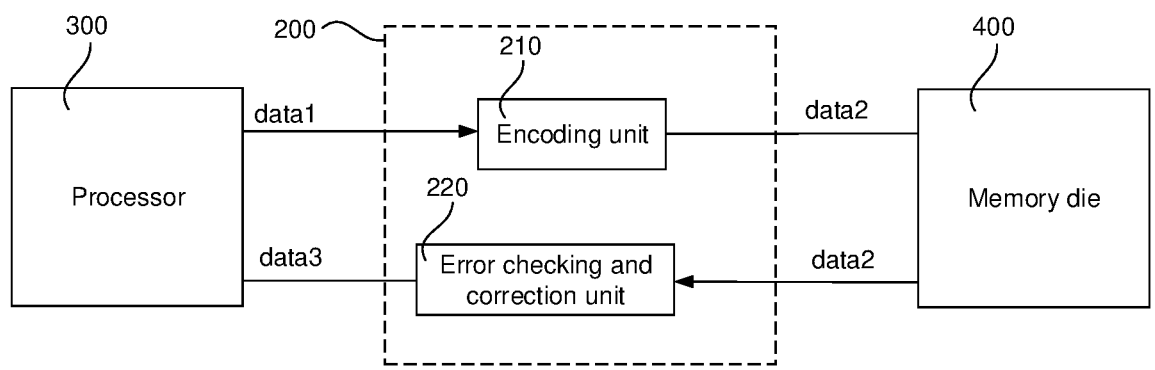
FIG. 9 is a second schematic structural diagram of a memory system according to an embodiment of the present application.

FIG. 9 is a second schematic structural diagram of a memory system according to an embodiment of the present application. Referring to FIG. 9, in some embodiments, the base die 200 may include: an encoding unit 210, configured to receive the first data data1 in the writing phase and perform the ECC encoding processing, to generate the encoded data; and an error checking and correction unit 220, configured to receive the second data data2 in the reading phase and perform the error checking and correction processing.

Specifically, the encoding unit 210 is connected between a data transmission port of the processor 300 and a data transmission port of the memory die 400, and the error checking and correction unit 220 is connected between the data transmission port of the processor 300 and the data transmission port of the memory die 400. The memory die 400 may include a first memory unit and a second memory unit, wherein the first memory unit stores the first data data1, and the second memory unit stores the encoded data.

The working principle of the memory system shown in FIG. 9 is described below by using 256-bit first data data1 and 16-bit encoded data as an example.

In the writing phase, the processor 300 transmits 256-bit first data data1 to the encoding unit 210; the encoding unit 210 receives the 256-bit data and performs ECC encoding processing, to generate 16-bit encoded data, wherein the 16-bit encoded data and the first data data1 form the second data data2; then, the encoding unit 210 transmits the second data data2 to the memory die 400, the first memory unit stores the 256-bit first data data1, and the second memory unit stores the 16-bit encoded data.

In the reading phase, the memory die 400 transmits the second data data2 to the error checking and correction unit 220, and the error checking and correction unit 220 performs error checking and correction. If the 256-bit first data data1 has no error, the 256-bit first data data1 is transmitted to the processor 300; if the 256-bit first data data1 has an error, error correction processing is performed on a bit where the error occurs, and the 256-bit first data data1 after the error correction processing is transmitted to the processor 300.

Figure 10:
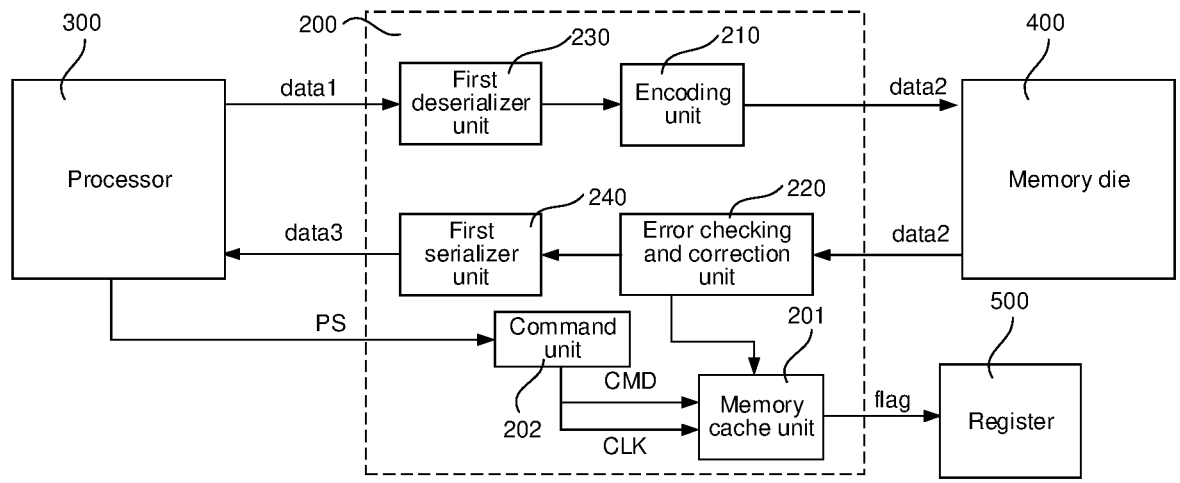
FIG. 10 is a third schematic structural diagram of a memory system according to an embodiment of the present application.

FIG. 10 is a third schematic structural diagram of a memory system according to an embodiment of the present application. Referring to FIG. 10, in some embodiments, in addition to the encoding unit 210 and the decoding unit 220, the base die 200 may further include: a first deserializer unit 230, configured to receive the first data data1 in the writing phase, perform first deserialization processing on the first data data1, and transmit the first data data1 after the first deserialization processing to the encoding unit 210; and a first serializer unit 240, configured to receive third data data3 in the reading phase, perform first serialization processing on the third data data3, and transmit the third data data3 after the first serialization processing to the processor 300.

Specifically, the first deserializer unit 230 is connected between the data transmission port of the processor 300 and a data transmission port of the encoding unit 210, and the first serializer unit 240 is connected between the data transmission port of the processor 300 and the data transmission port of the encoding unit 210. In this way, the number of transmission channels between the processor 300 and the base die 200 can be less than the number of bits of the first data data1, thereby reducing the number of transmission channels between the processor 300 and the base die 200. This can reduce the number of data transmission ports required by the base die 200 and the processor 300 and helps reduce the complexity of the electrical connection structure between the processor 300 and the base die 200, thereby saving the die areas of the processor 300 and the base die 200. The working principle of the memory system shown in FIG. 10 is described below by using 256-bit first data data1 and 16-bit encoded data as an example. It should be noted that, the encoding unit 210 and the error checking and correction unit 220 will not be described in detail again below.

In the writing phase, there may be 32 transmission channels between the processor 300 and the encoding unit 210. The 256-bit first data data1 is transmitted through the 32 transmission channels to the first deserializer unit 230 for deserialization processing; the first deserializer unit 230 outputs the 256-bit first data data1 transmitted in parallel, wherein the first data data1 is transmitted to the encoding unit 210 for encoding and then further transmitted to the memory die 400. In the reading phase, the 256-bit data outputted by the error checking and correction unit 220 after the error checking and correction is transmitted to the first serializer unit 240 for serialization processing, and the 256-bit first data data1 after the serialization processing may be transmitted to the processor 300 through the 32 transmission channels.

It should be noted that, in other embodiments, the number of transmission channels between the processor 300 and the encoding unit 210 may also be other appropriate values, for example, 128, 64 or 16.

Figure 11:
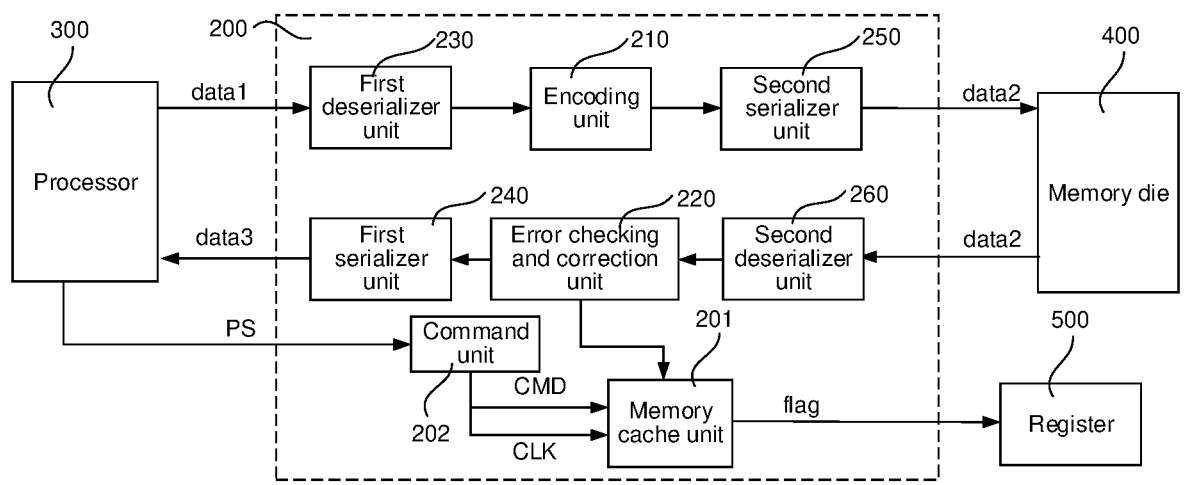
FIG. 11 is a fourth schematic structural diagram of a memory system according to an embodiment of the present application.

FIG. 11 is a fourth schematic structural diagram of a memory system according to an embodiment of the present application. Referring to FIG. 11, in some embodiments, in addition to the encoding unit 210, the decoding unit 220, the first deserializer unit 230, and the first serializer unit 240, the base die 200 further includes: a second serializer unit 250, configured to receive the second data data2 from the encoding unit 210 in the writing phase, perform second serialization processing, and transmit the second data data2 after the second serialization processing to the memory die 400; and a second deserializer unit 260, configured to receive the second data data2 from the memory die 400 in the reading phase, perform second deserialization processing, and transmit the second data data2 after the second deserialization processing to the error checking and correction unit 220.

Specifically, the second serializer unit 250 is connected between the data transmission port of the encoding unit 210 and the data transmission port of the memory die 400, and the second deserializer unit 260 is connected between the data transmission port of the memory die 400 and the data transmission port of the error checking and correction unit 220. In this way, the number of transmission channels between the memory die 400 and the base die 200 can be less than the number of bits of the first data data1, thereby reducing the number of transmission channels between the memory die 400 and the base die 200. This helps reduce the number of data transmission ports required by the base die 200 and the memory die 400 and helps reduce the complexity of the electrical connection structure between the memory die 400 and the base die 200, thereby saving the die areas of the memory die 400 and the base die 200. The working principle of the memory system shown in FIG. 11 is described below by using 256-bit first data data1 and 16-bit encoded data as an example. It should be noted that, the encoding unit 210, the error checking and correction unit 220, the first deserializer unit 230, and the first serializer unit 240 are not described in detail again below.

In the writing phase, the processor 300 transmits the 256-bit first data data1 to the first deserializer unit 230 through 32 transmission channels, wherein the encoding unit 210 performs ECC encoding processing on the first data data1 to obtain 16-bit encoded data. Next, the 256-bit first data data1 and the 16-bit encoded data are transmitted to the second serializer unit 250. The second serializer unit 250 performs serialization processing on the 256-bit first data data1 and transmits the data to the memory die 400 through 128 transmission channels. The second serializer unit 250 performs serialization processing on the 16-bit encoded data and transmits the data to the memory die 400 through 8 transmission channels.

In the reading phase, the 256-bit first data data1 is transmitted through 128 transmission channels to the second deserializer unit 260 for deserialization, and the 16-bit encoded data is transmitted through 8 transmission channels to the second deserializer unit 260 for deserialization. Next, the 256-bit first data data1 and the 16-bit encoded data are transmitted to the error checking and correction unit 220, and the 256-bit first data data1 outputted by the error checking and correction unit 220 is sequentially transmitted to the first serializer unit 240 and the processor 300.

It may be understood that, there are M data transmission channels between the processor 300 and the base die 200, and there are N data transmission channels between the base die 200 and the memory die 400, wherein M and N are both positive integers greater than 1, and N is greater than M. M being 32 and N being 128+8 is taken as an example for description above. In other embodiments, M and N may be any positive integers. For example, N may be 32+2, wherein 32 data transmission channels are used for transmitting the first data, and 2 data transmission channels are used for transmitting the encoded data. It may be understood that, since the N data transmission channels need to transmit not only the first data but also the encoded data, N is greater than M.

Figure 12:
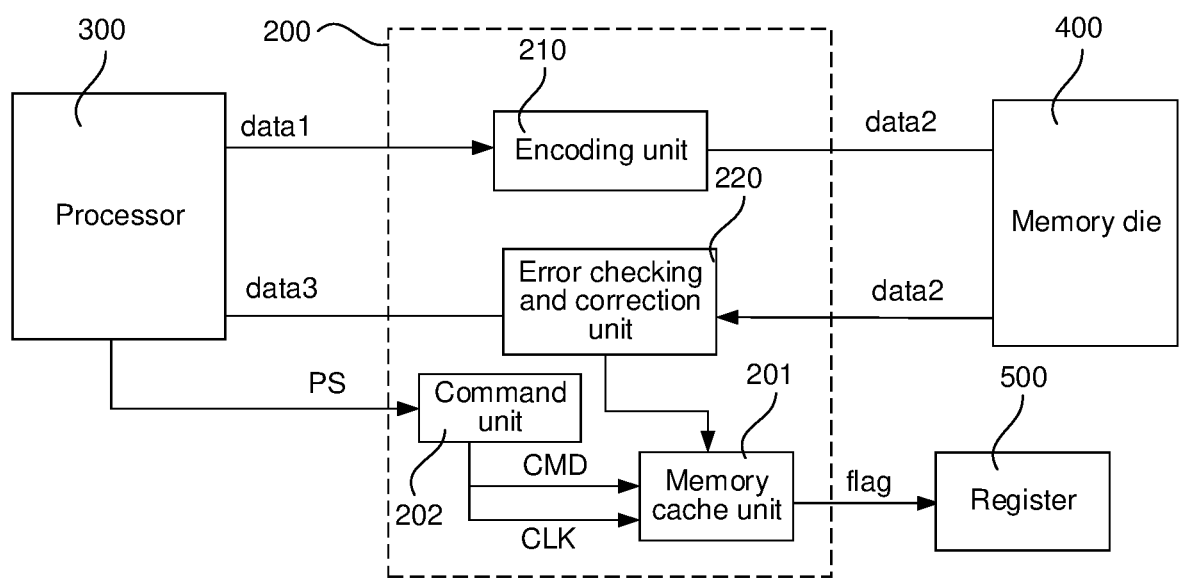
FIG. 12 is a fifth schematic structural diagram of a memory system according to an embodiment of the present application.

In some embodiments, as shown in FIG. 10 to FIG. 12, FIG. 12 is a fifth schematic structural diagram of a memory system according to an embodiment of the present application. The base die 200 is further configured to generate an error checking flag signal during the error checking and correction processing, and record errors of the first data data1 during transmission based on the error checking flag signal. The memory system further includes: a register 500, configured to record the errors of the first data data1 during transmission.

Specifically, the base die 200 may include: a memory cache unit 201, configured to store the errors of the first data data1 during transmission; and a command unit 202, configured to receive a polling instruction PS, and generate a command signal CMD and a clock signal CLK. The memory cache unit 201 is further configured to output a representation signal flag to the register 500 based on the command signal CMD and the clock signal CLK, wherein the representation signal flag represents the errors of the first data data1 during transmission.

In some embodiments, the processor 300 may further be configured to send a polling instruction PS to the command unit 202, that is, the processor 300 performs polling regularly, to control the memory cache unit 201 to output the representation signal flag to the register 500. It may be understood that, in other embodiments, the polling instruction may alternatively be provided by an external circuit.

For the description about the base die 200, reference may be made to the detailed description of the foregoing embodiment, and details are not described herein again.

In the memory system provided by the foregoing embodiment, the base die 200 can implement the error checking and correction function. Accordingly, neither the processor 300 nor the memory die 400 needs to have the error checking and correction function, which helps save the space and areas of the processor 300 and the memory die 400, thereby improving the storage performance of the memory die 400 and enhancing the storage performance of the memory system.

Accordingly, an embodiment of the present application further provides a semiconductor structure. The semiconductor structure may include the memory system provided by the foregoing embodiment. The semiconductor structure provided by the this embodiment of the present application is described in detail below with reference to the drawings. It should be noted that, for the parts the same as or corresponding to those mentioned in the foregoing embodiment, reference may be made to the foregoing embodiment, and details will not be described herein again.

Figure 13:
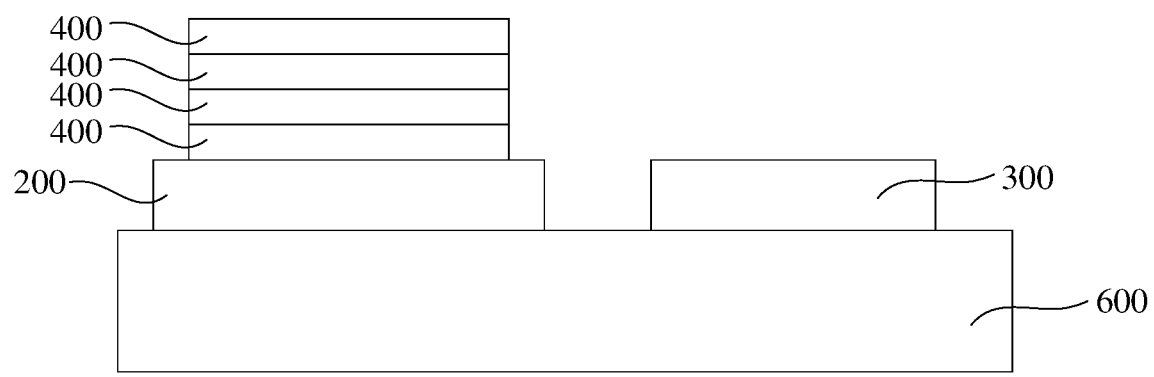
FIG. 13 is a cross-sectional schematic structural diagram of a semiconductor structure according to an embodiment of the present application.

FIG. 13 is a cross-sectional schematic structural diagram of a semiconductor structure according to an embodiment of the present application.

Referring to FIG. 13, the semiconductor structure includes: a carrier substrate 600; the memory system provided by the foregoing embodiment, wherein the processor 300 and the base die 200 are both located on a surface of the carrier substrate 600, and the memory die 400 is located on a surface of the base die 200 that is away from the carrier substrate 600.

The semiconductor structure may include a plurality of memory dies 400 stacked in sequence. The semiconductor structure may be a DARM device, a SRAM device, or other memories.

In some embodiments, the carrier substrate 600 may be a Printed Circuit Board (PCB). For the detailed description of the memory system, reference may be made to the foregoing embodiment, and details are not described herein again.

The semiconductor structure may be a 2.5-dimensional (2.5D) device. That is, the semiconductor structure is a stack structure, which helps reduce the size in a horizontal direction. In addition, the base die 200 in the semiconductor structure is used to implement the ECC error checking and correction function, thereby improving the performance of the semiconductor structure.

Those of ordinary skill in the art should understand that the above implementations are specific embodiments for implementing the present application. In practical applications, various changes may be made to the above implementations in terms of form and details without departing from the spirit and scope of the present application. Those skilled in the art may make changes and modifications to the implementations without departing from the spirit and scope of the present application. Therefore, the protection scope of the present application should be subject to the scope defined by the claims.

What is claimed is:

1. A base die, applied to a memory system, wherein
the base die is configured to receive first data in a writing phase, perform error correction code encoding processing to generate encoded data, and transmit second data to a memory die in the writing phase, wherein the second data comprises the first data and the encoded data; and receive the second data from the memory die in a reading phase, perform error checking and correction processing, and transmit third data in the reading phase, wherein the third data is the first data after the error checking and correction processing; and
the base die comprises:
an encoding unit, configured to receive the first data in the writing phase and perform the error correction code encoding processing to generate the encoded data;
an error checking and correction unit, configured to receive the second data in the reading phase and perform the error checking and correction processing;
a first deserializer unit, configured to receive the first data in the writing phase, perform first deserialization processing on the first data, and transmit the first data after the first deserialization processing to the encoding unit; and
a first serializer unit, configured to receive the third data in the reading phase, perform first serialization processing on the third data, and transmit the third data after the first serialization processing to a processor.

2. The base die of claim 1, further comprising:
a second serializer unit, configured to receive the second data from the encoding unit in the writing phase, perform second serialization processing, and transmit the second data after the second serialization processing to the memory die; and
a second deserializer unit, configured to receive the second data from the memory die in the reading phase, perform second deserialization processing, and transmit the second data after the second deserialization processing to the error checking and correction unit.

3. The base die of claim 1, wherein the base die is further configured to generate an error checking flag signal during the error checking and correction processing, and record errors of the first data during transmission based on the error checking flag signal.

4. The base die of claim 3, further comprising:
a memory cache unit, configured to store errors of the first data during transmission; and
a command unit, configured to receive a polling instruction, and generate a command signal and a clock signal;
wherein the memory cache unit is further configured to output a representation signal based on the command signal and the clock signal, the representation signal representing the errors of the first data during transmission.

5. The base die of claim 4, wherein the memory cache unit comprises a first input first output register.

6. A memory system, comprising a processor, a base die, and a memory die, wherein:
the processor is configured to transmit first data to the base die in a writing phase;
the base die is configured to receive the first data in the writing phase, perform error correction code encoding processing to generate encoded data, and transmit second data to the memory die in the writing phase, wherein the second data comprises the first data and the encoded data; and receive the second data from the memory die in a reading phase, perform error checking and correction processing, and transmit third data to the processor in the reading phase, wherein the third data is the first data after the error checking and correction processing;
the memory die is configured to receive the second data from the base die and store the second data in the writing phase, and transmit the second data to the base die in the reading phase; and
the base die comprises:
an encoding unit, configured to receive the first data in the writing phase and perform the error correction code encoding processing to generate the encoded data;
an error checking and correction unit, configured to receive the second data in the reading phase and perform the error checking and correction processing;
a first deserializer unit, configured to receive the first data in the writing phase, perform first deserialization processing on the first data, and transmit the first data after the first deserialization processing to the encoding unit; and
a first serializer unit, configured to receive the third data in the reading phase, perform first serialization processing on the third data, and transmit the third data after the first serialization processing to the processor.

7. The memory system of claim 6, wherein the base die further comprises:
a second serializer unit, configured to receive the second data from the encoding unit in the writing phase, perform second serialization processing, and transmit the second data after the second serialization processing to the memory die; and
a second deserializer unit, configured to receive the second data from the memory die in the reading phase, perform second deserialization processing, and transmit the second data after the second deserialization processing to the error checking and correction unit.

8. The memory system of claim 7, wherein M data transmission channels are provided between the processor and the base die, data transmission channels are provided between the base die and the memory die, M and N are both positive integers greater than 1, and N is greater than M.

9. The memory system of claim 6, wherein the base die is further configured to generate an error checking flag signal during the error checking and correction processing, and record, based on the error checking flag signal, errors of the first data during transmission; and
the memory system further comprises:
a register, configured to store the errors of the first data during transmission.

10. The memory system of claim 9, wherein the base die further comprises:
a memory cache unit, configured to store the errors of the first data during transmission; and
a command unit, configured to receive a polling instruction, and generate a command signal and a clock signal;
wherein the memory cache unit is further configured to output a representation signal to the register based on the command signal and the clock signal, the representation signal representing the errors of the first data during transmission.

11. The memory system of claim 10, wherein the processor is further configured to send the polling instruction to the command unit.

12. A semiconductor structure, comprising:
a carrier substrate; and
the memory system of claim 6, wherein the processor and the base die are both located on a surface of the carrier substrate, and the memory die is located on a surface of the base die that is away from the carrier substrate.

13. The semiconductor structure of claim 12, wherein the base die further comprises:
a second serializer unit, configured to receive the second data from the encoding unit in the writing phase, perform second serialization processing, and transmit the second data after the second serialization processing to the memory die; and
a second deserializer unit, configured to receive the second data from the memory die in the reading phase, perform second deserialization processing, and transmit the second data after the second deserialization processing to the error checking and correction unit.

14. The semiconductor structure of claim 13, wherein M data transmission channels are provided between the processor and the base die, N data transmission channels are provided between the base die and the memory die, M and N are both positive integers greater than 1, and N is greater than M.

15. The semiconductor structure of claim 12, wherein the base die is further configured to generate an error checking flag signal during the error checking and correction processing, and record, based on the error checking flag signal, errors of the first data during transmission; and
the memory system further comprises: a register, configured to store the errors of the first data during transmission.

16. The semiconductor structure of claim 15, wherein the base die further comprises:
a memory cache unit, configured to store the errors of the first data during transmission; and
a command unit, configured to receive a polling instruction, and generate a command signal and a clock signal;
wherein the memory cache unit is further configured to output a representation signal to the register based on the command signal and the clock signal, the representation signal representing the errors of the first data during transmission.

17. The semiconductor structure of claim 16, wherein the processor is further configured to send the polling instruction to the command unit.

18. A base die, applied to a memory system, wherein
the base die is configured to receive first data in a writing phase, perform error correction code encoding processing to generate encoded data, and transmit second data to a memory die in the writing phase, wherein the second data comprises the first data and the encoded data; and receive the second data from the memory die in a reading phase, perform error checking and correction processing, and transmit third data in the reading phase, wherein the third data is the first data after the error checking and correction processing;

wherein the base die is further configured to generate an error checking flag signal during the error checking and correction processing, and record errors of the first data during transmission based on the error checking flag signal.

19. The base die of claim 18, further comprising:

a memory cache unit, configured to store errors of the first data during transmission; and a command unit, configured to receive a polling instruction, and generate a command signal and a clock signal;

wherein the memory cache unit is further configured to output a representation signal based on the command signal and the clock signal, the representation signal representing the errors of the first data during transmission.

20. The base die of claim 19, wherein the memory cache unit comprises a first input first output register.

* * * * *